United States Patent [19]
Suyama et al.

[11] Patent Number: 5,909,425
[45] Date of Patent: Jun. 1, 1999

[54] OPTICAL INFORMATION REPRODUCTION APPARATUS HAVING A SEMICONDUCTOR LASER DEVICE LIGHT SOURCE

[75] Inventors: Takahiro Suyama, Yamatokoriyama; Mitsuhiro Matsumoto, Kashihara; Mototaka Taneya, Nara, all of Japan

[73] Assignee: Sharp Kabushiki Kaisha, Osaka, Japan

[21] Appl. No.: 08/844,278

[22] Filed: Apr. 18, 1997

[30] Foreign Application Priority Data

Apr. 23, 1996 [JP] Japan .................................. 8-101218

[51] Int. Cl.⁶ ............................................... G11B 7/00
[52] U.S. Cl. ........................................................ 369/121
[58] Field of Search ................................. 369/121, 122, 369/116

[56] References Cited

U.S. PATENT DOCUMENTS 5,386,409  1/1995  Yokota et al. ............................ 369/116

FOREIGN PATENT DOCUMENTS 1-232543  9/1989  Japan .

*Primary Examiner*—Thang V. Tran
*Attorney, Agent, or Firm*—Morrison & Foerster, LLP

[57] ABSTRACT

An optical information reproduction apparatus includes a semiconductor laser device as a light source which provides oscillation as periodic pulse waves upon application of a DC current. The semiconductor laser device is disposed so that an optical distance L from a light-emitting point of the semiconductor laser device to a recording surface of an optical recording medium satisfies the following relationship: $TP<(4L/C)$ and $T>TP+(2L/C)$, where T is a period of pulse waves which are output from the semiconductor laser device in absence of a returning light from the optical recording medium; TP is a pulse width of the respective pulse waves which is defined as a width of a portion of the respective pulse waves, the portion having intensities which correspond to 10% or more of the peak intensity of the respective pulse waves; and C is a speed of light through air.

8 Claims, 5 Drawing Sheets

(a) Self-sustaining pulsation light (b) Returning light though a coupling capacitor 23. The semiconductor laser device 24 is driven with the resultant current to oscillate a high-frequency pulse of hundreds of MHz. Thus, the coherency between the oscillating light inside the semiconductor laser device 24 and the returning light decreases so as to reduce the returning light noise. This prevents the semiconductor laser device 24 to operate with low noise.

OPTICAL INFORMATION REPRODUCTION APPARATUS HAVING A SEMICONDUCTOR LASER DEVICE LIGHT SOURCE

BACKGROUND OF THE INVENTION

1. Field of the Invention

The present invention relates to an optical information reproduction apparatus, and specifically to an optical information reproduction apparatus provided with a semiconductor laser device as a light source which provides oscillations as periodic light pulses upon receiving a DC current. More specifically, the present invention relates to an optical information reproduction apparatus in which a semiconductor laser device functions as a light source with low noise even if laser light reflected from a recording medium is present in the vicinity of the light source.

2. Description of the Related Art

In general, an optical information reproduction apparatus uses a semiconductor laser device as a light source for reading or writing information. In such an optical information reproduction apparatus, laser light emitted by the semiconductor laser device (the light source) is reflected from an optical disk and returns to the semiconductor laser device during reproduction of information, thus generating noise (i.e., so-called "returning light noise"), and thereby causing unstable laser oscillation. There are two well-known methods for reducing such returning light noise: one of them is a high-frequency superimposition method and the other is a self-sustaining pulsation method.

FIG. 1 schematically shows a structure of a driving circuit of a semiconductor laser device 24 used in a high-frequency superimposition method.

More specifically, the driving circuit includes a DC current supply circuit 21 and a high-frequency current superimposition circuit 22. A light output from the semiconductor laser device 24 is monitored by a photodiode 25. A high-frequency current of hundreds of MHz supplied from the high-frequency current superimposition circuit 22 is superimposed on a DC current supplied from the DC current supply circuit 21 through a coupling capacitor 23. The semiconductor laser device 24 is driven with the resultant current to oscillate a high-frequency pulse of hundreds of MHz. Thus, the coherency between the oscillating light inside the semiconductor laser device 24 and the returning light decreases so as to reduce the returning light noise. This prevents the semiconductor laser device 24 to operate with low noise.

On the other hand, according to the self-sustaining pulsation method, a self-sustaining pulsation type semiconductor laser device is used as a light source. More specifically, a semiconductor laser device is driven with a DC current so as to allow a pulse to self-oscillate at a frequency of about 1 GHz. This pulse oscillation decreases the coherency between the oscillating light inside the semiconductor laser device and the returning light so as to reduce the returning light noise. This permits the semiconductor laser device to operate with low noise.

Several structures of a self-sustaining pulsation type semiconductor laser device have been proposed. For example, FIG. 2 is a cross-sectional view showing an exemplary structure thereof.

More specifically, a self-sustaining pulsation type semiconductor laser device 100 shown in FIG. 2 includes an n-AlGaAS cladding layer 112, an AlGaAs active layer 113, a first p-AlGaAs cladding layer 114, and a current blocking layer 115, which are formed on an n-GaAs substrate 111 in this order. The current blocking layer 115 is provided with a stripe-shaped region 120 for serving as a current path. Furthermore, a second p-AlGaAs cladding layer 116 and a p-GaAs cap layer 117 are formed on the current blocking layer 113 in such a manner that the stripe-shaped region 120 is buried under the second p-AlGaAs cladding layer 116. Electrodes 118 and 119 are provided on the top surface of the p-GaAs cap layer 117 and on the bottom surface of the n-GaAs substrate 111, respectively.

In the semiconductor laser device 200 with the above-mentioned structure, the parameters of a device structure are adjusted in such a manner that the amount of a current to be injected into the active layer 113 becomes relatively small with respect to the width of an optical waveguide of a laser cavity. Thus, a self-sustaining pulsation operation can be achieved.

Japanese Laid-Open Patent Publication No. 1-232543 shows that there are high-frequency conditions suitable for reducing noise in the above-mentioned self-sustaining pulsation method. Specifically, it is proposed in the above-mentioned publication that in order to secure low returning light noise characteristics by the self-sustaining pulsation method, the relationship between a frequency of the self-sustaining pulsation and an optical distance from a light-emitting point of a semiconductor laser device to an information recording surface of an optical disk (hereinafter, referred to as an "optical path length") is suitably selected so as not to allow the returning light to be present at the light-emitting point of the semiconductor laser device during rising of a pulse wave.

More specifically, the publication states that in order to sufficiently reduce the returning light noise, it is required to prescribe an optical path length and a frequency of the self-sustaining pulsation so as to satisfy the following Formula (1):

$$n \times (C/2L) < fs < (n \times \tfrac{1}{2}) \times (C/2L) \tag{1}$$

where L is an optical path length, C is a speed of light, fs is a frequency of the self-sustaining pulsation, and n is 0 or a natural number.

However, according to the conventional high-frequency superimposition method as described above, a high-frequency current generated so as to be superimposed on a DC driving current may leak outside, resulting in noises which prevent various electronic circuits from operating normally. In order to solve such a problem, a shield which prevents leakage of a high-frequency current is required. However, this results in the enlargement of a device. Furthermore, according to this method, since a high-frequency current is superimposed onto a DC current, power consumption increases. These hinder the miniaturization of a device (in particular, the miniaturization of a system using a battery as a power source). In addition, large power consumption also makes it difficult to prolong battery life when a battery is used as a power source.

According to the self-sustaining pulsation method, the reduction of returning light noise is not necessarily achieved as expected.

SUMMARY OF THE INVENTION

The optical information reproduction apparatus of this invention includes a semiconductor laser device as a light source which provides oscillation as periodic pulse waves upon application of a DC current. The semiconductor laser device is disposed so that an optical distance L from a light-emitting point of the semiconductor laser device to a recording surface of an optical recording medium satisfies the following relationship:

$$TP < (4L/C)$$

and $$T > TP + (2L/C)$$

where T is a period of pulse waves, which are output from the semiconductor laser device in absence of a returning light from the optical recording medium; TP is a pulse width of the respective pulse waves, which is defined as a width of a portion of the respective pulse waves, the portion having intensities which correspond to 10% or more of the peak intensity of the respective pulse waves; and C is a speed of light through air.

In one embodiment, the period T and the pulse width TP are prescribed so as to satisfy the following relationship: $(TP/T) < (½)$.

Thus, the invention described herein makes possible the advantage of providing an optical information reproduction apparatus, specifically with a small optical path length, in which a self-sustaining pulsation type semiconductor laser device operates as a light source with low noise.

These and other advantages of the present invention will become apparent to those skilled in the art upon reading and understanding the following detailed description with reference to the accompanying figures.

DESCRIPTION OF THE PREFERRED EMBODIMENTS

Prior to the description of various embodiments of the present invention, the results of the study conducted by the inventors of the present invention will be described. The study was conducted in the course of achieving the present invention. The results of the study are intended to constitute a part of the present invention but not intended to constitute the state of the art of conventional techniques at the time when the present invention was made.

As described above, it was considered that the conventional self-sustaining pulsation method does not have problems as In the high-frequency superimposition method, and is capable of achieving a low noise operation by satisfying the conditions as proposed in Japanese Laid-Open Patent Publication No. 1-232543. However, the inventors of the present invention found that even in the case where an optical path length is small under the condition that n=0 in Formula (1) (i.e., a relationship 0<fs<(C/4L) or a modified relationship 0<L<(C/4fs) is satisfied), so that the returning light is not supposed to be present during rising of a self-sustaining pulsation wave at a light-emitting point of a semiconductor laser device, large returning light noise may be generated. Thus, the inventors of the present invention made it clear that relative intensity of noise (hereinafter, referred to as "RIN") increases even at a small optical path length under the condition that the relationship 0<L<(C/4fs) is satisfied (which has been considered to be in a low noise range).

The inventors of the present invention conducted a further study with respect to the above-mentioned problem. As a result, the following points were clarified: In the case of a small optical path length, time required for light to travel through an optical path between a light-emitting point of a semiconductor laser device which functions as a light source and an information recording surface of an optical disk is short. Therefore, when one pulse wave of the self-sustaining pulsation light is reflected from the information recording surface of the optical disk to return to the light-emitting point, the same pulse wave may be still oscillating at the light-emitting point. In such a situation, the pulse wave of the returning light influences the self-sustaining pulsation operation, resulting in unstable oscillation.

Figure 1:
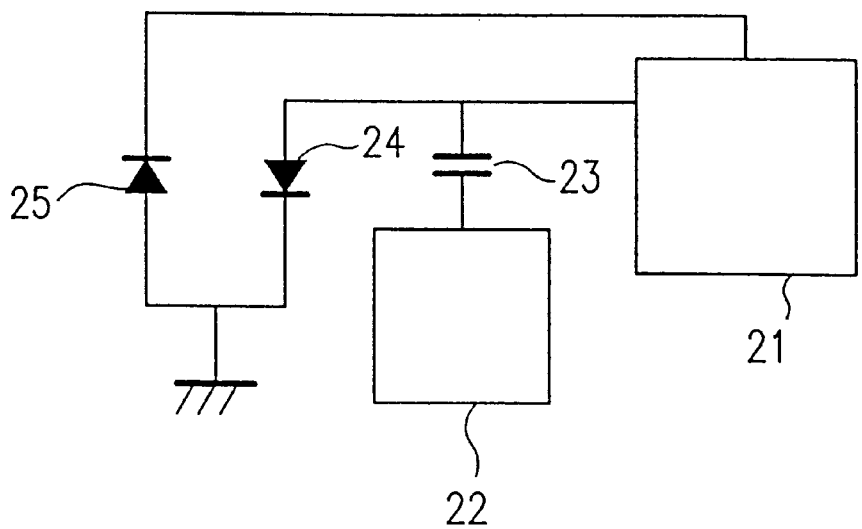
FIG. 1 schematically shows a circuit configuration of a typical driving circuit of a semiconductor laser device to be used in a high-frequency superimposition method.
Figure 2:
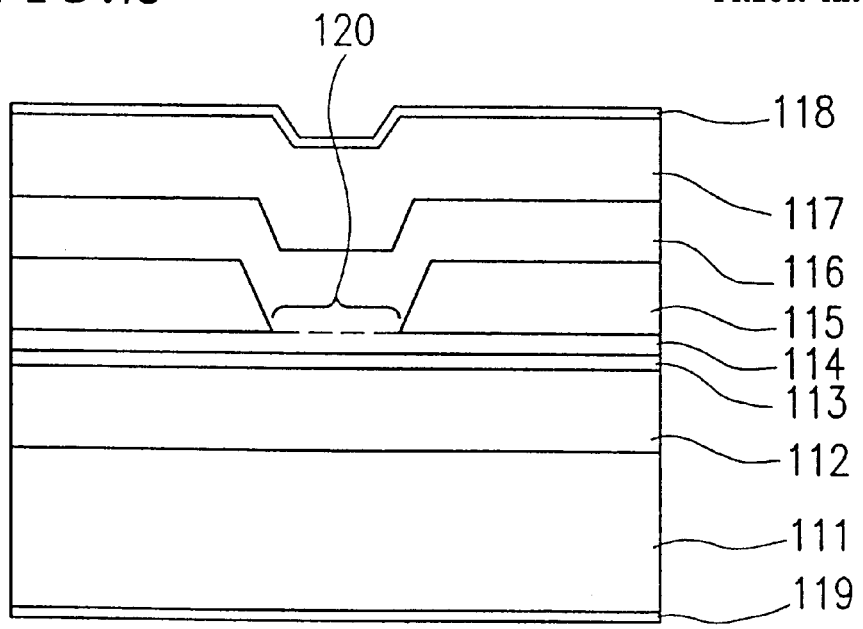
FIG. 2 schematically shows a cross-sectional view of an exemplary structure of a self-sustaining pulsation type semiconductor laser device.
Figure 3:
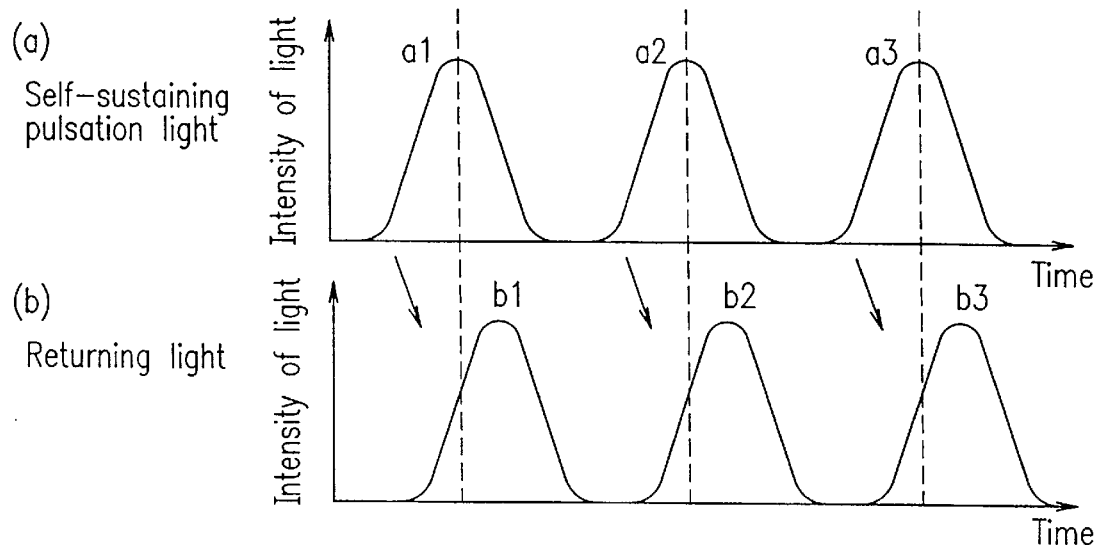
FIG. 3 schematically shows the relationship between time and the intensity of the pulse wave of the self-sustaining pulsation light in a laser cavity (see a portion (a)), as wall as the relationship between time and the intensity of the pulse wave of the returning light from an optical disk surface (see a portion (b)), with respect to a self-sustaining pulsation type semiconductor laser device with a small optical path length.

FIG. 3 schematically shows the relationship between time and the intensity of the pulse wave of the self-sustaining pulsation light in a laser cavity (see a portion (a)), as well as the relationship between time and the intensity of the pulse wave of the returning light from an optical disk surface (see a portion (b)), with respect to a self-sustaining pulsation type semiconductor laser device with a small optical path length.

As indicated by arrows in FIG. 3, the pulse waves of the returning light, represented by b1, b2 and b3 in the portion (b), correspond to the pulse waves of the self-sustaining pulsation light, represented by a1, a2 and a3 in the portion (a), respectively. As is understood from FIG. 3, when an optical path length is small, the pulse wave (b1, b2 or b3) of the returning light overlaps the peak of the pulse wave (a1, a2 or a3) of the corresponding self-sustaining pulsation light. According to the study by the inventors of the present invention, it was made clear that the RIN increases at the timing at which the pulse wave of the returning light overlaps the pulse wave of the corresponding self-sustaining pulsation light.

Regarding the above-mentioned problem, the inventors of the present invention clarified the following: Assume that T is a period of pulse waves which are output from a semiconductor laser device functioning as a light source under the condition that the returning light is not present, and TP is a pulse width of the respective pulse waves which is defined as a width of a portion of the respective pulse waves, the portion having intensities which correspond to 10% or more of the peak intensity of the respective pulse waves. By setting the respective components included in an optical information reproduction apparatus, specifically a semiconductor laser device as a light source, so as to satisfy the following two Formulae (2) and (3), noise caused by the returning light is prevented from being contained in the pulse light to be generated;

$$TP < (4L/C) \quad (2)$$

$$T > TP + (2L/C) \quad (3)$$

where C is a speed of light through air, and L is an optical path length previously described.

It is preferable that the period of a pulse wave T and the pulse width TP are prescribed so as to satisfy the following Formula (4):

$$(TP/T) < (\tfrac{1}{2}) \quad (4)$$

The reason why setting the components included in the optical information reproduction apparatus so as to satisfy Formulae (2) and (3) prevents the noise caused by the returning light from being contained in the pulse light will be described below.

Figure 4:
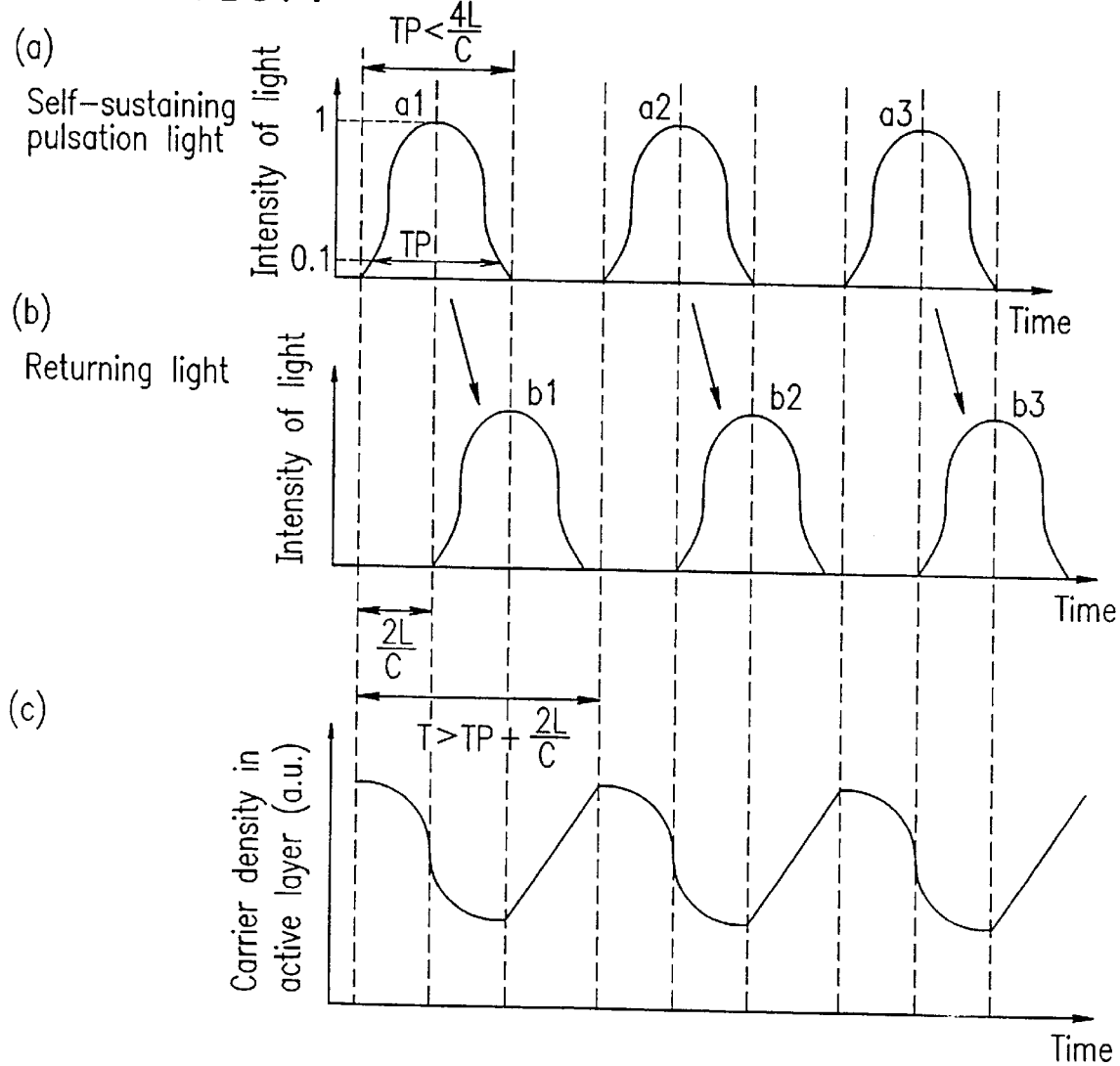
FIG. 4 schematically shows the relationship between time and the intensity of the pulse waves of the self-sustaining pulsation light in a laser cavity (see a portion (a)) and the relationship between time and the intensity of the pulse waves of the returning light from an optical disk surface (see a portion (b)), with respect to an optical information reproduction apparatus of the present invention including a self-sustaining pulsation type semiconductor laser device as a light source, as wall as further illustrates in a portion (c) the changes in a carrier density with time in an active layer of the semiconductor laser device on the time axis identical with that of the portions (a) and (b) of FIG. 4.

FIG. 4 schematically shows the relationship between time and the intensity of the pulse waves of the self-sustaining pulsation light in a laser cavity (see a portion (a)), and the relationship between time and the intensity of the pulse waves of the returning light from an optical disk surface (see a portion (b)), with respect to an optical information reproduction apparatus of the present invention, including a self-sustaining pulsation type semiconductor laser device as a light source. As indicated by arrows in FIG. 4, the pulse waves of the returning light, represented by b1, b2 and b3 in the portion (b), correspond to the pulse waves of the self-sustaining pulsation light, represented by a1, a2 and a3 in the portion (a), respectively. Furthermore, a portion (c) in FIG. 4 shows changes in a carrier density with time in an active layer of the semiconductor laser device on the time axis identical with that of the portions (a) and (b) of FIG. 4.

In FIG. 4, a time period required for an output light of the semiconductor laser device (the light source) to travel through an optical path length L and return to the semiconductor laser device as the returning light is constant (i.e., 2L/C). The intensity of the output light pulse does not reach its peak until a certain time period which substantially corresponds to a time period of TP/2 elapses after the commencement of the output of the pulse light. If the time period of TP/2 is shorter than the above-mentioned constant time period of 2L/C, the pulse wave of the returning light of the self-sustaining pulsation light returns to the semiconductor laser device after the intensity of the output light pulse exceeds its peak. Thereafter, the intensity of the returning light gradually increases. At this time, however, the intensity of the light pulse oscillated by the semiconductor laser device gradually decreases. Therefore, the light intensity in the laser cavity becomes sufficiently weak during a time period when the intensity of the returning light tends to have significant influences on the self-sustaining pulsation operation, i.e., during a time period at around the timing at which the intensity of the returning light reaches its peak.

Furthermore, after a time period of TP+(2L/C) elapses, the intensity of the returning light becomes sufficiently small. Here, in the case where Formula (3) is satisfied, a nest pulse wave starts oscillating inside the semiconductor laser device after the time period of TP+(2L/C) elapses. Thus, under the condition that Formula (3) is satisfied, the returning light of one pulse wave of the self-sustaining pulsation light does not overlap the next pulse wave of the self-sustaining pulsation light, whereby the returning light influences the next self-sustaining pulsation operation less.

In the above description and FIG. 4, during a time period when the intensity of the returning light pulse is less than 10% of its peak intensity, the influence of the returning light on the self-sustaining pulsation light is sufficiently small. Therefore, the pulse width TP during which the self-sustaining pulsation tends to be influenced is defined so as to correspond to a width of a portion (of the pulse) having intensities which is 10% or more of the peak intensity.

Furthermore, with respect to the carrier density as shown in the portion (c) of FIG. 4, carriers are not consumed in an active layer by induced emission while the laser is not oscillated. Therefore, in such a time period, the carrier density in the active layer gradually increases, as the semiconductor laser device is supplied with a driving current. The gain of the laser device also increases with the increase in the carrier density. When a certain balance is achieved between the increased gain and a loss of the laser device determined by its structure, laser oscillation starts, and thereafter, the carriers are consumed at a high rate by induced emission. In the self-sustaining pulsation operation, the amount of consumed carriers exceeds the amount of carriers supplied by the injection of a current, whereby the carrier density in the active layer decreases.

In the case where the above-mentioned conditions of the present invention are satisfied, the returning light is present while the carrier density decreases or laser oscillation stops. However, the influence of such a returning light on the laser oscillation is considered to be less.

Thus, in accordance with the present invention, under the condition that the above-mentioned Formulae (2) and (3) are satisfied, the self-sustaining pulsation operation is prevented from becoming unstable due to the returning light, and a self-sustaining operation type semiconductor laser device can be operated with low noise.

The present invention has been achieved based on the above-mentioned results of the study by the inventors of the present invention. Hereinafter, the present invention will be described by way of illustrative embodiments with reference to the accompanying drawings.

EXAMPLE 1

Figure 5:
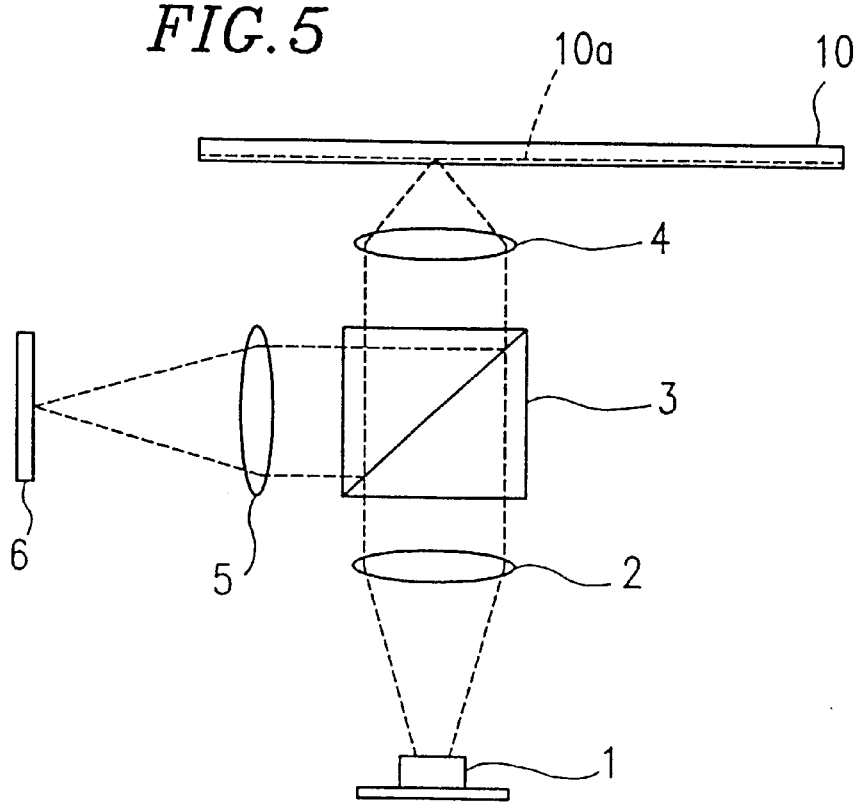
FIG. 5 schematically shows a structure of an optical information reproduction apparatus according to the present invention.

FIG. 5 schematically shows a structure of an optical information reproduction apparatus according to the present invention.

The optical information reproduction apparatus of the present invention includes a self-sustaining pulsation type semiconductor laser device 1 as a light source, a collimating lens 2, a beam splitter 3, an objective lens 4, a lens 5 for the converting reflected light, and a photodetector 6 for detecting the converged light.

In the optical information reproduction apparatus, the laser light emitted by the semiconductor laser device 1 is converted into collimated light by the collimating lens 2, passes through the beam splitter 3, and is converged onto an information recording surface 10a of an optical disk 10 by the objective lens 4. The laser light converged onto the information recording surface 10a of the optical disk 10 is reflected therefrom, passes through the objective lens 4 again, and reaches the beam splitter 3. The laser light is then split by the beam splitter 3 and converged onto the photodetector 6 by the lens 5. Thus, information recorded on the information recording surface 10a of the optical disk 10 is read out.

The laser operation characteristics of the semiconductor laser device 1 included in the above-mentioned structure as a light source can be adjusted by altering the structural parameters thereof.

Figure 6:
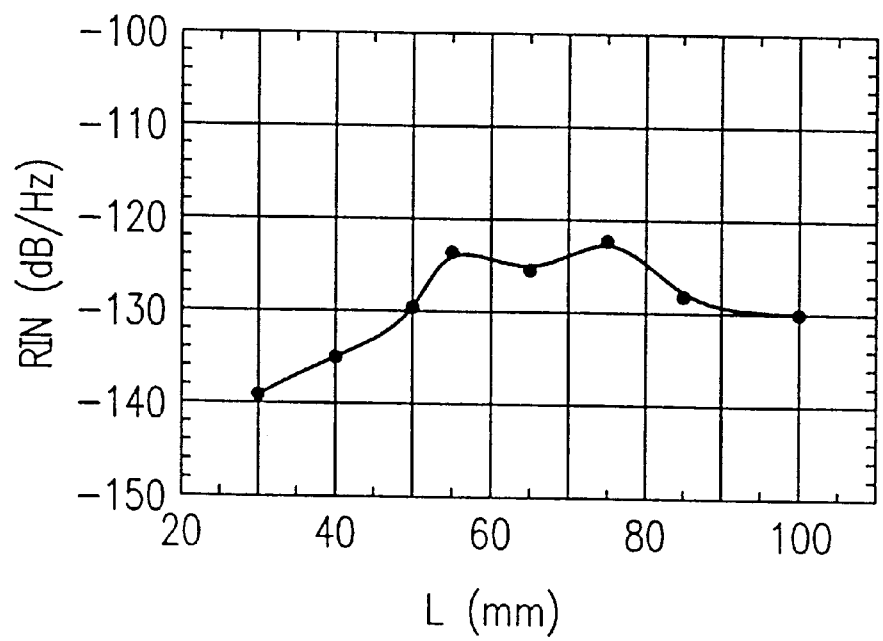
FIG. 6 shows the measured relationship between the relative intensity of noise (RIN) and the optical path length L in the optical information reproduction apparatus of the first example of the present invention.

FIG. 6 shows the measured results of the RIN, obtained when changing the optical path length L from about 30 mm to about 100 mm, using the above-mentioned optical information reproduction apparatus. More specifically, the abscissa axis and the ordinate axis in FIG. 6 represent an optical path length L and an RIN, respectively. The semiconductor laser device 1 to be used as a light source in this case has a self-sustaining pulsation frequency fs of about 1.35 GHz in the absence of the returning light, and a pulse width TP of the self-sustaining pulsation light of about 400 ps.

As is understood from FIG. 6, when the optical path length L is about 50 mm or less, a low noise condition where RIN=about −130 dB/Hz or less can be achieved. However, when the optical path length L is about 50 mm or more, RIN is about −130 dB/Hz or more, which is not a sufficient low noise condition for the optical information reproduction apparatus. According to the study by the inventors of the present invention, in the case where a stable self-sustaining pulsation operation is achieved, a low noise condition where RIN=about −130 dB/Hz or less is realized; therefore, in order to obtain a reproduced signal, in a satisfactorily good condition, it is desirable that such a low noise condition is obtained.

As described above, when the optical path length L is about 50 mm or less, Formulae (2) and (3) are both satisfied, and a low noise condition where RIN=about −130 dB/Hz or less is obtained. In contrast, when the optical path length L is about 50 mm or more, Formula (3) is not satisfied.

EXAMPLE 2

The optical information reproduction apparatus of Example 2 has basically the same structure as that of Example 1 which is illustrated in FIG. 5. The descriptions therefor are omitted here. The optical information reproduction apparatus of the present example is different from that in the previous example in that a semiconductor laser device which functions as a light source is capable of operating at a high output.

More specifically, end facets of the semiconductor laser device included as a light source in the optical information reproduction apparatus of the present example are subjected to a coating process so as to have a light reflectance of 10% on its front facet and a light reflectance of 80% on its reverse facet. The semiconductor laser device 1 typically has a self-sustaining pulsation frequency fs of about 900 MHz in the absence of the returning light, and a pulse width TP of the self-sustaining pulsation light of about 600 ps.

Figure 7:
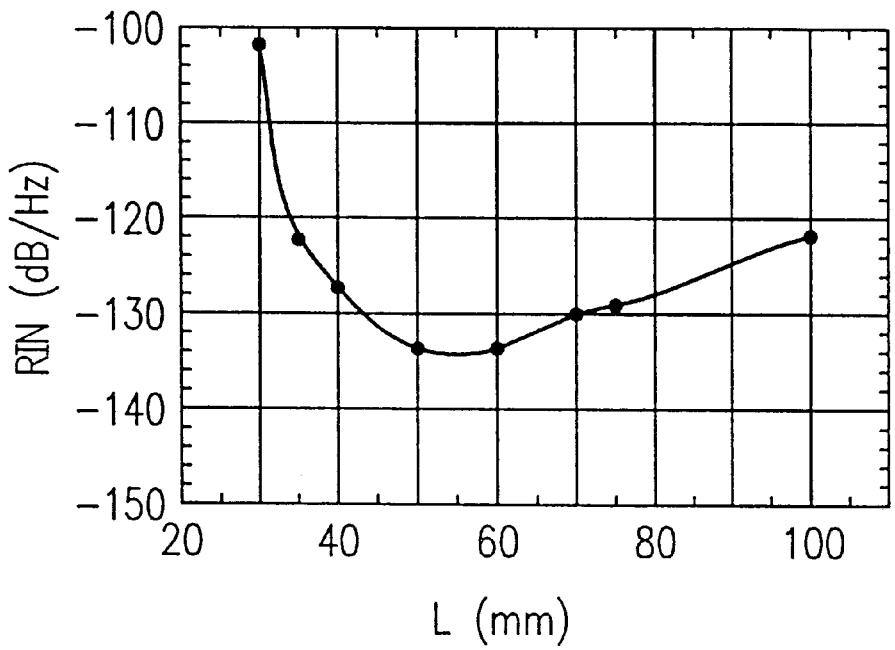
FIG. 7 shows the measured relationship between the relative intensity of noise (RIN) and the optical path length, L in the optical information reproduction apparatus of the second example of the present invention.

FIG. 7 shows the measured results of the RIN, obtained when changing the optical path length L from about 30 mm to about 100 mm, using the above-mentioned optical information reproduction apparatus. More specifically, the abscissa and the ordinate in FIG. 7 represent an optical path length L and an RIN, respectively.

As is understood from FIG. 7, when the optical path length L is in the range of about 45 mm to about 70 mm, a low noise condition where RIN=about −130 dB/Hz or less can be achieved However, when the optical path length L is about 35 mm or less, RIN becomes about −130 dB/Hz or more, which is not a sufficient low noise condition for the optical information reproduction apparatus. In particular, when the optical path length L is about 30 mm, the RIN is about −100 dB/Hz. Such specific phenomenon that the RIN characteristics degrade when an optical path length is small has been found by the present inventors during the course of research to achieve the present invention.

On the other hand, when the optical path length L is about 75 mm or more, the RIN also becomes about −130 dB/Hz or more, which is not a sufficient low noise condition for the optical information reproduction apparatus As described above, in the optical information reproduction apparatus of the present example, when the optical path length L is in the range of about 45 to about 70 mm, Formulae (2) and (3) previously described are both satisfied, and a low noise condition where the RIN=about −130 dB/Hz or less is obtained. In contrast, when the optical path length L is about 40 mm or less, Formula (2) is not satisfied, while when the optical path length L is about 70 mm or more, Formula (3) is not satisfied. In any of these cases, noise increases.

EXAMPLE 3

The optical information reproduction apparatus of Example 3 has basically the, same structure as that of Example 1 which is illustrated in FIG. 5. The descriptions therefor are omitted here. The optical information reproduction apparatus of the present example is different from that in the previous example in that a semiconductor laser device to be used as a light source is capable of operating in such a manner that the self-sustaining pulsation characteristics satisfy Formulae (2) and (3) so as to obtain satisfactory noise characteristics even in the case of a small optical path length.

Figure 8:
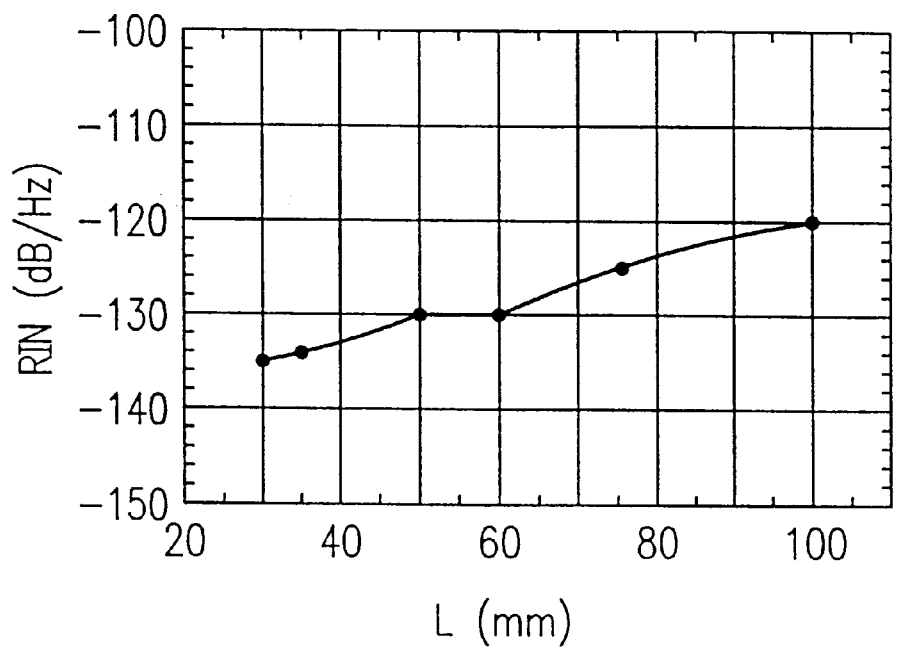
FIG. 8 shows the measured relationship between the relative intensity of noise. (RIN) and the optical path length L in the optical information reproduction apparatus of the third example of the present invention.

FIG. 8 shows the measured results of the RIN, obtained when changing the optical path length L from about 30 mm to about 100 mm, using the above-mentioned optical information reproduction apparatus. More specifically, the abscissa axis and the ordinate axis in FIG. 8 represent an optical path length L and an RIN, respectively.

As is understood from FIG. 8, when the optical path length L is in the range of about 30 mm to about 60 mm, Formula (2) is satisfied, and a low noise condition RIN= about −130 dB/Hz or less can be achieved. However, when the optical path length L exceeds 60 mm, Formula (3) is not satisfied, and the RIN becomes about −130 dB/Hz or more, which is not a sufficient low noise condition for the optical information reproduction apparatus.

As described above, according to the present invention, the operational characteristics and the optical path length of a semiconductor laser device of an optical information reproduction apparatus are set so as to satisfy Formulae (2) and (3), whereby satisfactory noise characteristics can be obtained.

Furthermore, when the self-sustaining pulsation characteristics and the optical path length are set so as to also satisfy Formula (4) as wall as Formulae (2) and (3), the condition TP<(2L/C) can be satisfied in view of Formulae (3) and (4). This means that the pulse wave of the returning light returns to a light-emitting point of a semiconductor laser device while laser oscillation stops, i.e., between adjacent pulses of laser oscillation. This completely reduces the influence of the returning light on the self-sustaining pulsation operation, whereby more stable low noise characteristics can be obtained.

Furthermore, when a semiconductor laser device to be used as a light source tends to induce a higher intensity of the returning light, for example, when a high-output semiconductor laser device whose front facet is coated so as to have a reflectance lower than that of a non-coated facet is used, the advantage of the present invention of reducing noise (which is obtainable by satisfying the above-described conditions of the present invention) is enhanced.

As described above, according to the present invention, an optical information reproduction apparatus using a self-sustaining pulsation type semiconductor laser device as a light source is constructed so as to satisfy Formulae (2) and (3), whereby a stable self-sustained pulsation operation is obtained, and low returning light noise characteristics of a semiconductor laser device can be achieved.

The conditions to be satisfied by the optical information reproduction apparatus of the present invention are effective with respect to any optical path length. In particular, the conditions are effective in the case where the optical path length is small (e.g., about 50 mm). Furthermore, the optical information recording apparatus satisfying Formula (4) contributes to a more stable self-sustaining pulsation operation.

Various other modifications will be apparent to and can be readily made by those skilled in the art without departing from the scope and spirit of this invention. Accordingly, it is not intended that the scope of the claims appended hereto be limited to the description as sat forth herein, but rather that the claims be broadly construed.

What is claimed is:

1. An optical information reproduction apparatus, comprising a self-sustaining pulsation type semiconductor laser device as a light source which provides oscillation as periodic pulse waves upon application of a DC current, wherein the self-sustaining pulsation type semiconductor laser device is disposed so that an optical distance L from a light-emitting point of the self-sustaining pulsation type semiconductor laser device to a recording surface of an optical recording medium satisfies the following relationship:

$$TP<(4L/C)$$

and $$T>TP+(2L/C)$$

where T is a period of pulse waves, which are output from the self-sustaining pulsation type semiconductor laser device in absence of a returning light from the optical recording medium; TP is a pulse width of the respective pulse waves, which is defined as a width of a portion of the respective pulse waves, the portion having intensities which correspond to 10% or more of the peak intensity of the respective pulse waves; and C is a speed of light through air.

2. An optical information reproduction apparatus according to claim 1, wherein the period T and the pulse width TP are prescribed so as to satisfy the following relationship: $(TP/T)<(½)$.

3. An optical information reproduction apparatus according to claim 1, wherein the respective pulse waves which are output from the self-sustaining pulsation type semiconductor laser device are substantially in a sine wave.

4. An optical information reproduction apparatus according to claim 2, wherein the respective pulse waves which are output from the self-sustaining pulsation type semiconductor laser device are substantially in a sine wave.

5. An optical information reproduction apparatus according to claim 1, wherein a relationship of $(2L/C)<TP<(4L/C)$ is satisfied.

6. An optical information reproduction apparatus according to claim 2, wherein a relationship of $(2L/C)<TP<(4L/C)$ is satisfied.

7. An optical information reproduction apparatus according to claim 1, wherein a carrier density of an active layer of the self-sustaining pulsation type semiconductor laser device is equal to or less than half of its maximum level when a returning light from the optical recording medium arrives at the self-sustaining pulsation type semiconductor laser device.

8. An optical information reproduction apparatus according to claim 2, wherein a carrier density of an active layer of the self-sustaining pulsation type semiconductor laser device is equal to or less than half of its maximum level when a returning light from the optical recording medium arrives at the self-sustaining pulsation type semiconductor laser device.

* * * * *